(12) United States Patent
Mukherjee et al.

(10) Patent No.: US 11,082,271 B2
(45) Date of Patent: Aug. 3, 2021

(54) METHODS AND APPARATUS FOR PERFORMING A HIGH SPEED PHASE DEMODULATION SCHEME USING A LOW BANDWIDTH PHASE-LOCK LOOP

(71) Applicant: Texas Instruments Incorporated, Dallas, TX (US)

(72) Inventors: Subhashish Mukherjee, Bangalore (IN); Abhijit Anant Patki, Bangalore (IN); Madhulatha Bonu, Bangalore (IN); Kumar Anurag Shrivastava, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/900,010

(22) Filed: Jun. 12, 2020

(65) Prior Publication Data
US 2020/0313945 A1 Oct. 1, 2020

Related U.S. Application Data

(63) Continuation of application No. 15/860,988, filed on Jan. 3, 2018, now Pat. No. 10,728,068, which is a
(Continued)

(51) Int. Cl.
*H04L 27/22* (2006.01)
*H03D 3/00* (2006.01)
(Continued)

(52) U.S. Cl.
CPC ............. *H04L 27/22* (2013.01); *H03D 3/00* (2013.01); *H03K 19/21* (2013.01); *H03L 7/081* (2013.01);
(Continued)

(58) Field of Classification Search
None
See application file for complete search history.

(56) References Cited

U.S. PATENT DOCUMENTS

| 3,838,350 A | 9/1974 | Ewanus et al. |
| 4,577,163 A | 3/1986 | Culp |

(Continued)

FOREIGN PATENT DOCUMENTS

| CN | 1494794 | * | 5/2004 |
| CN | 1494794 A | | 5/2004 |

(Continued)

OTHER PUBLICATIONS

CN10368445, EPO machine translation (Year: 2014).*
(Continued)

*Primary Examiner* — Berhanu Tadese
(74) *Attorney, Agent, or Firm* — Ebby Abraham; Charles A. Brill; Frank D. Cimino

(57) ABSTRACT

Methods and apparatus for performing a high speed phase demodulation scheme using a low bandwidth phase-lock loop are disclosed. An example apparatus includes a low bandwidth phase lock loop to lock to a data signal at a first phase, the data signal capable of oscillating at the first phase or a second phase; and output a first output signal at the first phase and a second output signal at the second phase, the first output signal or the second output signal being utilized in a feedback loop of the low bandwidth phase lock loop. The example apparatus further includes a fast phase change detection circuit coupled to the low bandwidth phase lock loop to determine whether the data signal is oscillating at the first phase or the second phase.

10 Claims, 8 Drawing Sheets

Related U.S. Application Data continuation of application No. 15/200,706, filed on Jul. 1, 2016, now Pat. No. 9,893,916.

(51) Int. Cl.

| | |
|---|---|
| *H03L 7/081* | (2006.01) |
| *H04L 27/227* | (2006.01) |
| *H03K 19/21* | (2006.01) |
| *H03L 7/087* | (2006.01) |
| *H03L 7/113* | (2006.01) |
| *H04L 7/033* | (2006.01) |
| *H04L 7/00* | (2006.01) |

(52) U.S. Cl.
CPC .............. *H03L 7/087* (2013.01); *H03L 7/113* (2013.01); *H04L 7/0331* (2013.01); *H04L 27/2271* (2013.01); *H04L 7/0087* (2013.01)

(56) References Cited

U.S. PATENT DOCUMENTS

| | | | |
|---|---|---|---|
| 4,764,730 A | 8/1988 | Miyo et al. | |
| 4,843,617 A | 6/1989 | Marshall et al. | |
| 4,920,322 A | 4/1990 | Ruijs | |
| 5,414,689 A | 5/1995 | Maeda et al. | |
| 5,438,692 A | 8/1995 | Mojindra | |
| 5,459,757 A | 10/1995 | Minuhin et al. | |
| 5,559,777 A | 9/1996 | Maeda et al. | |
| 5,590,157 A | 12/1996 | Schuur | |
| 5,793,825 A * | 8/1998 | Humphreys | H03L 7/093 |
| | | | 331/25 |
| 6,081,905 A * | 6/2000 | Larsson | H04L 7/0337 |
| | | | 713/503 |
| 6,087,578 A | 7/2000 | Kay | |
| 6,103,964 A | 9/2000 | Kay | |
| 6,121,532 A | 9/2000 | Kay | |
| 6,121,533 A | 9/2000 | Kay | |
| 6,140,869 A | 10/2000 | Troise | |
| 6,150,889 A * | 11/2000 | Gulliver | H03L 7/143 |
| | | | 331/14 |
| 6,222,420 B1 * | 4/2001 | Gulliver | H03L 7/143 |
| | | | 331/14 |
| 6,334,203 B1 | 12/2001 | Inagawa | |
| 6,466,058 B1 | 10/2002 | Goldman | |
| 6,549,604 B2 | 4/2003 | Shenoi | |
| 6,639,911 B1 * | 10/2003 | Bingham | H04L 1/0003 |
| | | | 370/352 |
| 6,741,109 B1 | 5/2004 | Huang et al. | |
| 6,765,972 B1 | 7/2004 | Kawasaki et al. | |
| 6,960,948 B2 | 11/2005 | Kizer et al. | |
| 7,026,852 B2 * | 4/2006 | Hsiao | G11B 7/0945 |
| | | | 327/147 |
| 7,177,611 B2 | 2/2007 | Goldman | |
| 7,184,512 B2 * | 2/2007 | Takeshita | H03D 13/004 |
| | | | 327/147 |
| 7,190,755 B1 | 3/2007 | Sung et al. | |
| 7,554,412 B2 | 6/2009 | Kojima et al. | |
| 7,813,178 B2 | 10/2010 | Nakai | |
| 8,373,463 B1 | 2/2013 | Chenakin | |
| 8,422,594 B2 | 4/2013 | Kargl et al. | |
| 8,508,266 B2 | 8/2013 | Frantzeskakis et al. | |
| 8,669,798 B2 | 3/2014 | Frantzeskakis et al. | |
| 8,686,770 B2 | 4/2014 | Frantzeskakis et al. | |
| 9,252,791 B1 * | 2/2016 | Sinha | H03L 7/099 |
| 9,438,257 B1 | 9/2016 | Perdoor et al. | |
| 9,893,916 B2 * | 2/2018 | Mukherjee | H03L 7/113 |
| 10,728,068 B2 * | 7/2020 | Mukherjee | H04L 7/0331 |
| 2002/0071502 A1 | 6/2002 | Chan et al. | |
| 2002/0114405 A1 * | 8/2002 | Sindhushayana | H04L 27/2272 |
| | | | 375/316 |
| 2003/0142775 A1 * | 7/2003 | Takeshita | H03D 13/004 |
| | | | 375/376 |
| 2004/0202271 A1 | 10/2004 | Fahim | |
| 2005/0007720 A1 * | 1/2005 | Hsiao | H03L 7/08 |
| | | | 361/152 |
| 2006/0164138 A1 | 7/2006 | Kakuta | |
| 2007/0035348 A1 | 2/2007 | Self | |
| 2008/0080658 A1 | 4/2008 | Huang | |
| 2008/0151656 A1 | 6/2008 | Nakai | |
| 2008/0269928 A1 | 10/2008 | May | |
| 2008/0292038 A1 | 11/2008 | Ide | |
| 2009/0284318 A1 | 11/2009 | Machado | |
| 2010/0134156 A1 | 6/2010 | Lin et al. | |
| 2010/0232548 A1 | 9/2010 | Balakrishnan et al. | |
| 2010/0283549 A1 * | 11/2010 | Wang | H03L 7/1976 |
| | | | 331/34 |
| 2012/0076252 A1 * | 3/2012 | Futami | H04L 27/2272 |
| | | | 375/376 |
| 2012/0139595 A1 | 6/2012 | Kamath et al. | |
| 2014/0031076 A1 * | 1/2014 | Tang | G01R 31/2832 |
| | | | 455/550.1 |
| 2015/0162921 A1 | 6/2015 | Chen et al. | |
| 2015/0341041 A1 * | 11/2015 | Balachandran | H03L 7/085 |
| | | | 327/156 |
| 2018/0006856 A1 * | 1/2018 | Mukherjee | H03L 7/113 |
| 2018/0131545 A1 * | 5/2018 | Mukherjee | H03K 19/21 |
| 2020/0313945 A1 * | 10/2020 | Mukherjee | H03L 7/113 |

FOREIGN PATENT DOCUMENTS

| | | | | |
|---|---|---|---|---|
| CN | 101882928 | * | 11/2010 | |
| CN | 101882928 A | | 11/2010 | |
| CN | 103684445 | * | 3/2014 | |
| CN | 103684445 A | | 3/2014 | |
| CN | 104488194 | * | 4/2015 | |
| CN | 104488194 A | | 4/2015 | |
| CN | 105187055 | * | 12/2015 | |
| CN | 105187055 A | | 12/2015 | |
| CN | 107566309 A | * | 1/2018 | .............. H03D 3/00 |
| JP | 56087212 A | * | 7/1981 | |
| JP | 01152846 A | * | 6/1989 | |
| JP | 08138324 A | | 5/1996 | |
| JP | 11122232 A | | 4/1999 | |
| JP | 2012075028 | * | 4/2012 | |
| JP | 2012075028 A | | 4/2012 | |
| RU | 2556429 C1 | * | 7/2015 | |

OTHER PUBLICATIONS

First Office Action: Chinese Patent Application No. 2017105198629; dated Apr. 6, 2021, and English Translation; 14 pages.

National Intellectual Property Administration, PRC; translation of Notification of First Office Action and Search Report; dated Apr. 6, 2021; 6 pages.

* cited by examiner

METHODS AND APPARATUS FOR PERFORMING A HIGH SPEED PHASE DEMODULATION SCHEME USING A LOW BANDWIDTH PHASE-LOCK LOOP

CROSS REFERENCE TO RELATED APPLICATION(S)

This application is a continuation of U.S. patent application Ser. No. 15/860,988, filed Jan. 3, 2018, which claims priority to U.S. patent application Ser. No. 15/200,706, filed Jul. 1, 2016 (now U.S. Pat. No. 9,893,916), both of which are hereby incorporated herein by reference.

FIELD OF THE DISCLOSURE

This disclosure relates generally to phase demodulation and, more particularly, to methods and apparatus for performing a high speed phase demodulation scheme using a low bandwidth phase-lock loop.

BACKGROUND

Wireless receivers receive carrier waves (e.g., data transmission signals) that include embedded data. In some examples, the data is embedded into such carrier waves using a phase shift keying modulation scheme. Phase shift keying includes changing (e.g., modulating) the phase of the carrier wave to convey the data. In such examples, a receiver demodulates the carrier waves to identify the data embedded in the carrier wave. In some examples, phase-lock loops are utilized to demodulate phase shift keyed carrier waves.

SUMMARY

Examples disclosed herein provide a high speed phase demodulation scheme using a low bandwidth phase-lock loop. An example apparatus includes a low bandwidth phase lock loop to lock to a data signal at a first phase or a second phase, the data signal capable of oscillating at the first phase or a second phase. In such an example apparatus, the low bandwidth phase lock loop is structured to output a first output signal at the first phase and a second output signal at the second phase, the first output signal or the second output signal being utilized in a feedback loop of the low bandwidth phase lock loop. Such an example apparatus further includes a fast phase change detection circuit coupled to the low bandwidth phase lock loop to determine whether the data signal is oscillating at the first phase or the second phase. In such an example apparatus, the fast phase change detection circuit is structured to, when the data signal is oscillating at the first phase, output a first logic value. In such an example apparatus, the fast phase change detection circuit is structured to, when the data signal is oscillating at the second phase, output a second logic value, the output of the fast phase change detection circuit being used to determine whether the first output signal or the second output signal will be utilized in the feedback loop of the low bandwidth phase lock loop.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
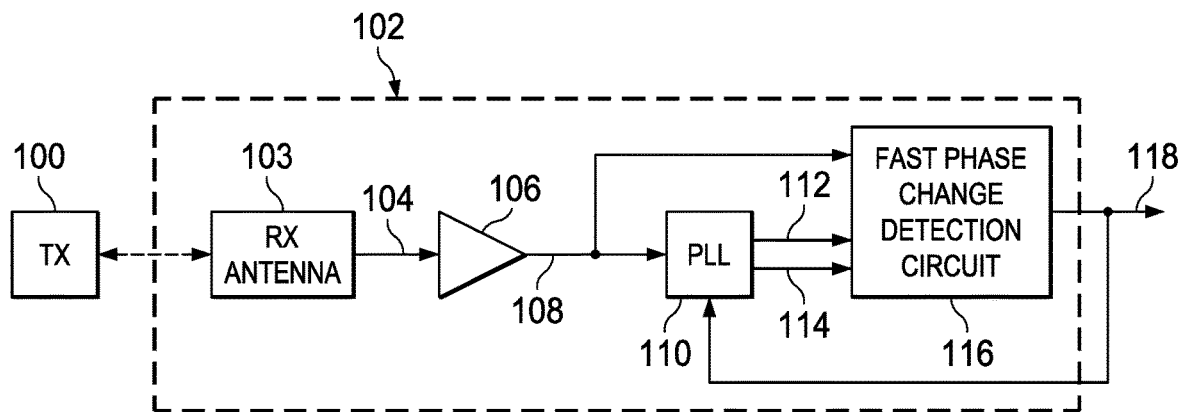
FIG. 1 is an illustration including an example receiver providing a high speed phase demodulation scheme using a low bandwidth phase-lock loop.

In data communications, a carrier wave is modulated with data based on a chosen communication scheme and transmitted to the receiver. The receiver receives the data transmission signal and decodes (e.g., demodulates) the data from the data transmission signal to identify the data embedded in the data transmission signal. In some examples, the data is embedded using phase-shift keying. Phase-shift keying includes conveying data by modulating the phase of the carrier wave to represent different values of data. For example, in a binary phase-shift keying scheme, a carrier wave may be transmitted at a first phase for a duration of time to represent a binary value of '0' and transmitted at a second phase for a duration of time to represent a binary value of '1.' In such an example, the receiver demodulates the phase of the data transmission signal to identify a series of '0' and '1's representing data that may be processed by a circuit and/or a processor. In some examples, the transmitter and/or receiver may run a training sequence to determine how the phases of the carrier signal correspond to binary data '0' or '1' based on the data transition from '1' to '0' or '0' to '1'. However, often channel effects alter the transmitted carrier wave so that the transmitted carrier wave is not the same as when received, due to channel effects and/or other impairments of hardware in the receiver. Thus, receivers include a phase-lock loop (PLL) to compensate for any effects and/or impairments.

A PLL locks a received carrier wave with an oscillating wave generated by an oscillator to eliminate any error associated with hardware of the receiver. PLL locks a received carrier signal with the signal fed back from oscillator both in frequency and phase. Different phases of a voltage controlled oscillator (VCO) output signal are used to demodulate (e.g., decode) carrier wave (e.g., data transmission signals) that have been keyed using a phase shift-keying scheme. Examples disclosed herein include a PLL that, initially, locks into the phase of a received carrier wave. The VCO in the PLL loop is designed in such a way that two or more possible phases (e.g., same as the phases that are used for Phase shift keying of the data transmission signal) are also available as output signals. For example, if a carrier wave may oscillate at a first phase or a second phase, the VCO in the examples PLLs disclosed herein output two phases, one corresponding to the first phase and one corresponding to the second phase. As further described below, the PLL remains locked to the correct phase that is fed into the slow PLL loop and the correct phase of the oscillating signal from VCO is chosen based on the output of a fast phase change detection circuit.

The data rate is associated with how quickly the receiver demodulates and this is limited by the loop bandwidth of the PLL in the receiver. For example, high data rate (e.g., greater than 100 Megabits per second) may be achieved using a high speed PLL (e.g., the speed that a voltage controlled oscillator of the PLL can change the output frequency in response to a change in the input). A high speed PLL (e.g., 100 Megabits per second) can lock to an incoming input faster than a low speed (e.g., slow) PLL as the VCO will see the changes on the input faster which is the output of the loop filter in the PLL, and hence changes the frequency and phase of the VCO output signal that is fed back into the PLL loop. However, high speed PLLs are more complex with high power consumption.

Examples disclosed herein utilize a slow PLL and a fast phase change detection circuit to demodulate carrier waves at a high data rate (e.g., greater than 100 Megabits per second). Examples disclosed herein are less complex than high speed PLLs. As used herein, a logic zero corresponds to binary value '0' and logic one corresponds to binary value '1.'

Examples disclosed herein utilize a slow PLL to generate two or more phases of the locked receiver signal to lock to the received data transmission signal based on the phase shift that the received data transmission signal has. For example, if the received data transmission signal is keyed using two phases (e.g., a zero degree phase and a ninety degree phase, for example) the slow PLL may generate a first phase signal and a second phase signal. The first phase signal is an oscillating signal that has the same frequency and phase as the received data transmission signal oscillating at the first phase. The second phase signal is an oscillating signal that has the same frequency and phase as the received data transmission signal oscillating at the second phase. Using example disclosed herein, the slow PLL generates oscillating signals with the same phases as the phases associated with the carrier wave due to prior knowledge of the system and the PSK communication scheme that is implemented in the transmitter. The fast phase change detection circuit enables the PLL to remain in lock by switching the VCO output signal that is fed back into the PLL loop to the correct choice of phase of the VCO output signal. This is possible due to the prior knowledge of the system and the sequencing of phases done in transmitter.

In some examples, a receiver may have prior knowledge of a transmitter's phase shift sequence (e.g., which phases the transmitter may use to encode a carrier wave) to determine which phases should be available from the VCO as output signals so that the VCO output signal's phase (e.g., that is fed into the slow PLL) can lock to the possible phase shift sequence of a carrier wave immediately without delay (the delay is limited by the speed of the fast phase change detection circuit).

Alternatively, the slow PLL may output any number and/or degree of phases corresponding to any number and/or degree of phases associated with a carrier wave. For example, if a carrier wave oscillates at three phases (e.g., zero degree, ninety degree, and 180 degree), the PLL may output three VCO output signal phases corresponding to the three possible phases of the carrier wave.

Examples disclosed herein include a fast phase change detection circuit to provide a fast path phase change detection scheme and demodulate the received carrier signal into a stream of data embedded in the example carrier wave. Using example disclosed herein, the fast phase change detection circuit allows the PLL structure to lock into a phase associated with the carrier wave regardless of the carrier wave changing phases. Using examples disclosed herein, a fast path phase change detection signal output by the fast phase change detection circuit is used to change to the correct VCO output signal phase used in the feedback loop of the PLL. Thus, the fast path phase change detection signal output by the fast phase change detection circuit is utilized by the PLL to utilize the VCO output phase that matches the current phase of the carrier wave. For example, when a receiver receives a carrier wave that may operate at a first phase or a second phase, the example PLL locks the incoming input phase (e.g., the carrier signal) with the VCO output phase. The convention to decode this phase of the VCO and the output of the fast phase change detection circuit can be determined based on training sequence. Once the convention is fixed using the training sequence, any new phase shift of the input signal can be detected as a logic '0' to logic '1' data transition or vice versa. The two phases that will be utilized by the phase sequencing of the carrier wave are available from the VCO due to prior knowledge of the PSK scheme that is being used in the system. In this manner, the example PLL utilizes the first phase or the second phase of the VCO output in the feedback loop of the PLL based on the output signal available from the fast phase change detection circuit FIG. 1 illustrates an example transmitter (e.g., TX) 100 wirelessly transmitting data to an example receiver 102. The example TX 100 transmits data via a phase-shift keyed modulated carrier wave. The example receiver 102 includes an example receiver antenna 103, an example received data transmission signal line 104, and example amplifier 106, an example amplified data transmission signal line 108, an example PLL 110, an example first phase output line 112, and example second phase output line 114, an example fast phase change detection circuit 116, an example data output line 118. This example shows only 2 output phases from PLL assuming BPSK communication. The number of phases can be more based on higher order PSK (like QPSK) communication scheme.

The example transmitter 100 of FIG. 1 transmits a data transmission signal (e.g., an oscillating signal coded with data) using phase-shift keying (PSK). The example transmitter 100 may include a controller to convert data into a PSK data transmission signal and an antenna to transmit the PSK data transmission signal. Phase-shift keying includes wirelessly transmitting a carrier wave to be received by a receiver (e.g., the example receiver 102). Although the carrier wave is described herein as a sinusoidal wave, any type of carrier wave may alternatively be used. The example transmitter 100 may shift the phase associated with sinusoidal wave to any number of different phases to represent data. For example, binary PSK (e.g., BPSK) includes outputting the sinusoidal wave at a first phase (e.g., a zero degree phase shift, for example) to represent a binary logic value of '0' and outputting the sinusoidal wave at a second phase (e.g., a ninety degree phase shift, for example) to represent a binary logic value of '1.' In such an example, the transmitter 100 may output data serially by shifting the sinusoidal wave at set intervals between the first phase and the second phase based on the data pattern that needs to be conveyed. Alternatively, the example transmitter 100 may transmit data using any number of phases to do phase-shift keying based on the data rate to be achieved The example receiver 102 of FIG. 1 receives the data transmission signal from the example transmitter 100 and processes the data transmission signal to determine the data embedded in the data transmission signal. The example receiver 102 includes the example receiver antenna 103. The example receiver antenna 103 intercepts electromagnetic signals (e.g., the data transmission signal) transmitted by the example transmitter 100. The example receiver antenna 103 may be an electric antenna, a magnetic antenna, a linear antenna, a loop antenna, an aperture antenna, an array antenna, and/or any other type of antenna. The intercepted electromagnetic signals are converted into alternating current to extract desired data from the electromagnetic signals. In some examples, the example receiver antenna 103 is structured to only receive electromagnetic signals at one frequency. In some examples, the example receiver antenna 103 is structured to receive electromagnetic signals at various frequencies. The example receiver antenna 103 may be enclosed within the example receiver 102. For example, the example receiver antenna 103 may include one or more inductors, capacitors, and/or any other electrical components to receive electromagnetic signals. Alternatively, the example receiver antenna 103 may be attached externally to the receiver 102. In some examples, the receiver antenna 103 also transmits electromagnetic signals to the example transmitter 100. In some examples, the receiver antenna includes two or more antennas. The example receiver antenna 103 outputs received data transmission signals on the example received data transmission signal line 104.

The example amplifier 106 amplifies data transmission signals received from the example receiver antenna 103 via the example data transmission signal line 104. The example amplifier 106 is an electronic amplifier that increases the power of (e.g., provides gain to) the received data transmission signal. The example amplifier 106 may be a power amplifier, a valve amplifier, a transistor amplifier, a magnetic amplifier, an operational amplifier, a differential amplifier, and/or any other type of amplifier. The example amplifier 106 transmits the amplified data transmission signal to the example PLL 110 and the example fast phase change detection circuit 116 via the example amplified data transmission signal line 108.

The example PLL 110 is a control system that receives the amplified data transmission signal line 108 and locks to the phase of the example amplified data transmission signal. In the illustrated example, the PLL 110 outputs a first output signal corresponding to a first phase (e.g., matching the phase of the amplified data transmission signal) via the example first phase output line 112 and a second output signal corresponding to a second phase (e.g., matching the phase of the amplified data transmission signal which is phase shifted to second phase via the example second phase output line 114. Alternatively, the example PLL 110 may output only one signal that may correspond to the first phase or the second phase, as further described in conjunction with FIG. 3. In some examples, the example PLL 110 may output any number of output signals to correspond to any number of phases (e.g., forty five degree phase, ninety degree phase, etc.) based on the order of the PSK communication used to achieve higher data rate. In some examples, the system of FIG. 1 may have prior knowledge of a transmitter's phase shift sequence (e.g., which phases the transmitter may use to encode a carrier wave and in which order) to determine which phases are necessary to output from the VCO inside the PLL loop so that the VCO output phases may match the possible phase shifts of a carrier wave quickly with not much delay. Thus, higher data rate PSK communication is achievable.

In the illustrated example, the PLL 110 is an extremely low bandwidth (e.g., slow) PLL. Because the PLL 110 is a slow PLL, the example PLL 110 can move to the right phase that needs to be used in the feedback loop of the PLL without losing lock and without much drift in control voltage to the VCO. The sluggish PLL loop filter makes the VCO not see the changes in the control voltage and hence the drift in frequency and phase of the VCO output signals are small during the duration of time when the fast phase change detection circuit detects the phase change on the data transmission signal. The correct phase of the VCO used in the feedback loop of the PLL is enabled by the fast phase change detection circuit output on line 114, whenever phase shift happens on the amplified data transmission signal. The example PLL 110 is further described in conjunction with FIGS. 2 and 3.

The example fast phase change detection circuit 116 is a control system that compares the amplified data transmission signal (e.g., via the example amplified transmission signal line 108) with the first VCO output signal at a first phase via the example first phase output line 112 and the second VCO output signal at a second phase via the example second phase output line 114 by the example PLL 110. The example fast phase change detection circuit 116 converts the phase difference related pulses to a signal which is representative of the data. The phase difference related pulses are filtered, and converted into a dc voltage level that is amplified and compared to a threshold voltage using a comparator. A high to low or low to high transition on the comparator output determines the data pattern that was received by the receiver. For example, if the data transmission signal is oscillating at a first phase, the example fast phase change detection circuit 116 may output a digital value of '1.' Additionally, if the data transmission signal is oscillating at a second phase, the example fast phase change detection circuit 116 may output a digital value of '0.' As further described in conjunction with FIG. 2, the example fast phase change detection circuit 116 outputs the digital value on the example data output line 118. The example data output line 118 may be transmitted to a circuit, processor, and/or any other computing device to process the data output signal. In some examples, the system may run a training sequence to determine how the phases of the carrier signal correspond to which data transition, for example, from '1' to '0' or '0' to '1.' Additionally, the example fast phase change detection circuit 116 outputs a fast phase change detection signal that is fed back to the example PLL 110 via the example data output line 118 to flag a phase change so that the example PLL 110 can retain the lock and not drift the frequency and phase of the VCO output signals generated, as further described in conjunction with FIGS. 2 and 3.

Figure 2:
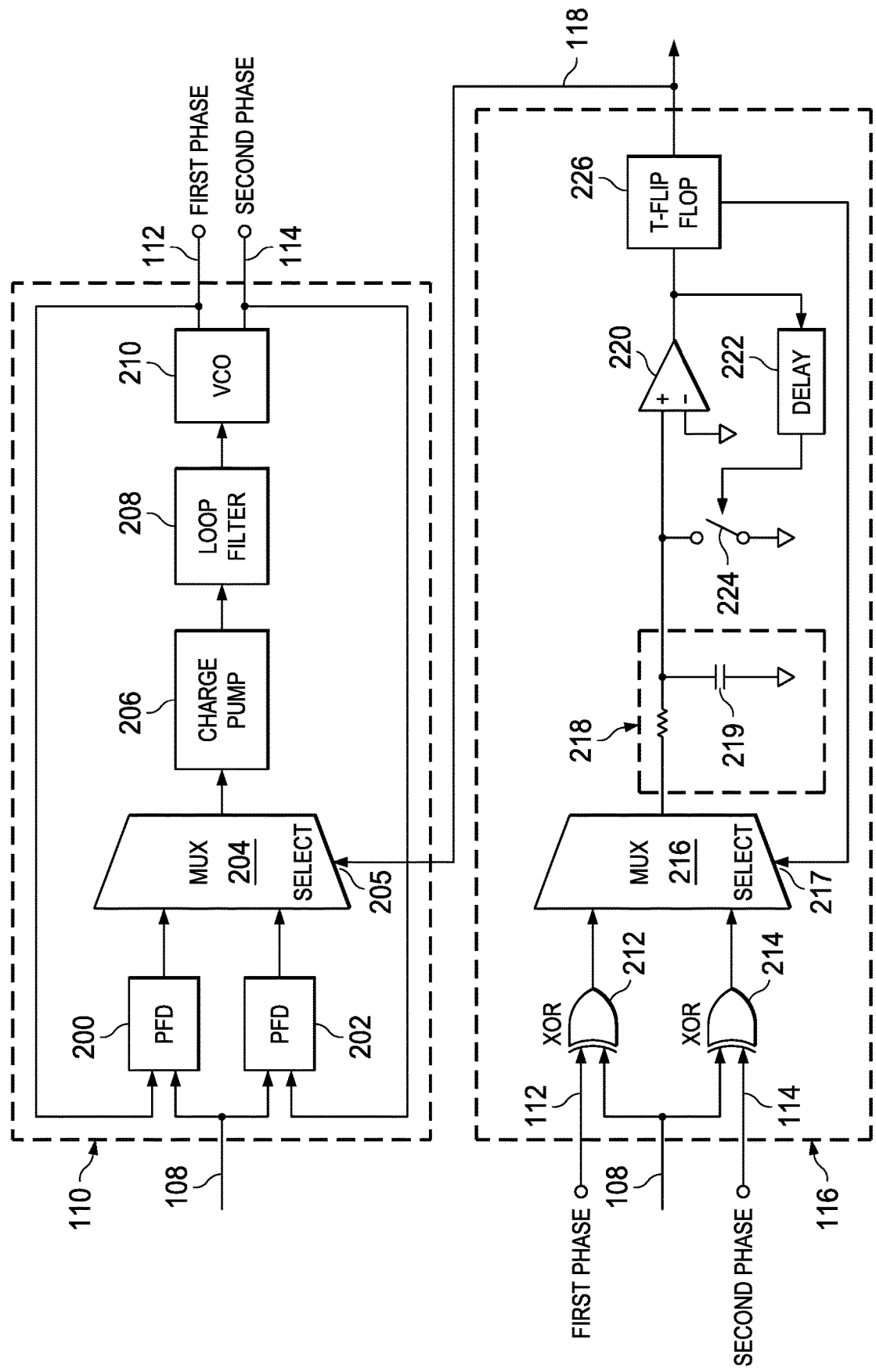
FIG. 2 is a circuit structure of the actual high speed demodulation scheme which includes the slow phase lock loop and an example fast phase change detection circuit of FIG. 1.

FIG. 2 is an example circuit structure of the example PLL 110 and the example fast phase change detection circuit 116 of FIG. 1. The example PLL 110 includes an example first phase frequency detector 200, a second phase frequency detector 202, a first example multiplexer (MUX) 204, an example select input 205, an example charge pump 206, an example loop filter 208, and an example voltage controlled oscillator 210. The example fast phase change detection circuit 116 includes example exclusive or (XOR) circuits 212, 214, a second example MUX 216, an example select input 217, an example low pass filter 218, an example capacitor 219, an example amplifier-cum-comparator 220 (e.g., implemented as a comparator that compares the filtered signal from 218 with a threshold voltage and generates an output that transitions from 1 to 0 or 0 to 1 based on the data transition), an example delay circuit 222, an example switch 224 to reset the capacitor 219 in the low pass filter 218, and an example toggle (T) flip flop 226 configured in divide by 2 configuration. The example first phase frequency detector 200 compares the phase of the amplified data transmission signal via the example amplified data transmission signal line 108 to the VCO first output signal at a first phase by the example PLL 110 via the example first phase output line 112. The output of the first phase frequency detector 200 is a series of pulses representing the phase difference between the amplified data transmission signal and the first VCO output signal at the first phase.

The example second phase frequency detector 202 compares the phase of the amplified data transmission signal via the example amplified data transmission signal line 108 to the VCO second output signal at a second phase by the example PLL 110 via the example second phase output line 114. The output of the second phase frequency detector 202 is a series of pulses representing the phase difference between the amplified data transmission signal and the second VCO output signal at the second phase.

The example MUX 204 is an integrated circuit that receives multiple inputs and outputs one or more of the multiple inputs based on the example select (e.g., control) input 205. The example MUX 204 has a first input, a second input, the select input 205, and an output. Alternatively, the example MUX 204 may have any number of inputs and/or outputs. In the example PLL 110, the first input receives the output of the first example phase frequency detector 200 and the output of the second example phase frequency detector 202. The select input 205 is the fast path phase change detection signal from the example fast phase change detection circuit 116 via the example data output line 118. The example MUX 204 outputs the output of the first phase frequency detector 200 or the output of the second phase frequency detector 202 based on a logic level of the fast path phase change detection signal on the example data output line 118. For example, if the fast path phase change detection signal on the example data output line 118 is logic '0' the MUX 204 may output the output of the example first phase frequency detector 200. In such examples, if the fast path phase change detection signal on the example data output line 118 is logic '1' the MUX 204 may output the output of the example second phase frequency detector 202. The output of the example MUX 204 is the input to the example charge pump 206.

The example charge pump 206 is a high efficiency power converter. The example charge pump 206 receives the output of the MUX 204 (e.g., the phase error output by the first phase frequency detector 200 or the phase error output by the second phase frequency detector 202) and outputs an analog charge corresponding to the phase error between the received data signal and the phase of the VCO output signal. The example charge pump 206 may be a tri-stage charge pump, a current steering charge pump, a differential input with single-ended charge pump, a fully differential charge pump, and/or any other type of charge pump. In some examples, the example PLL 110 may not include a charge pump and may input the output of the MUX 204 directly to the example loop filter 208.

The example loop filter 208 receives the outputted charge of the example charge pump 206 and coverts the analog charge into a voltage/current signal which serves as control voltage/current to the example voltage controlled oscillator 210. In some examples, when the input of the example loop filter 208 is oscillating, the example loop filter 208 may act as a low pass filter to smooth the received input. Alternatively, when the input of the example loop filter 208 is a pulse signal (e.g., such as when the PLL 110 does not include the example charge pump 206), the example loop filter 208 may act like a storage device (e.g., a voltage storage device) holding a voltage associated with an ideal output phase (e.g., an output signal whose phase matches the amplified data transmission signal).

The example voltage controlled oscillator 210 receives the output of the example loop filter 208 and outputs two oscillating output signals via the example first phase output line 112 and the example second phase output line 114 based on the received output. The outputs of the example voltage controlled oscillator 210 correspond to the received signal from the example loop filter 208. In the illustrated example, the first phase output is an oscillating signal whose phase is the same as the phase of the amplified data transmission signal and the second phase signal is an oscillating signal whose phase is shifted by a predetermined angle from the first phase of the amplified data transmission signal. Alternatively, the example voltage controlled oscillator 210 may output or may include any number of outputs based on any phase angle (e.g., forty-five degree phase, ninety degree phase, one hundred and twenty degree phase, etc.) based on the phase shift sequencing in the transmitter and the order of the PSK communication.

The first example XOR circuit 212 outputs a result of an exclusive or function based on two received inputs (e.g., an error signal). In the illustrated example, the first example XOR circuit 212 compares (e.g., exclusive ors) the first phase output signal of the example voltage controlled oscillator (e.g., via the example first phase output line 112) to the amplified data transmission signal (e.g., via the example data transmission output line 108). In this manner, when the first phase output signal and the amplified data transmission signal are in phase (e.g., the first phase output signal is substantially oscillating in unison with the amplified data transmission signal), the first example XOR circuit 212 will output a binary value of '0.' When the amplified data transmission signal changes phases (e.g., to a ninety degree phase, for example), the amplified data transmission signal will be out of phase (e.g., ninety degrees out of phase) with the first phase output signal. In this manner, the example XOR circuit 212 will output pulses (e.g., of '0's and '1's)

which is representative of the phase difference. Thus, the example XOR circuit 212 will output a '0' when the inputs are in phase (e.g., the first phase signal is in phase with the amplified data transmission signal) and output a series of pulses when the inputs are out of phase (e.g., the first phase signal is not in phase with the amplified data transmission signal after a phase shift on the data).

The second example XOR circuit 214 outputs a result of an exclusive or function based on two received inputs (e.g., an error signal). In the illustrated example, the second example XOR circuit 214 compares (e.g., exclusive ors) the second output signal at a second phase by the example voltage controlled oscillator (e.g., via the example second phase output line 114) to the amplified data transmission signal (e.g., via the example data transmission output line 108). In this manner, when the second VCO output signal at a second phase and the amplified data transmission signal are in phase, the second example XOR circuit 214 will output a binary value of '0.' When the amplified data transmission signal changes phases (e.g., to a first phase), the amplified data transmission signal will be out of phase with the second VCO output signal at the second phase. In this manner, the example XOR circuit 214 will output pulses (e.g., of '0's and '1's) which is representative of the phase difference. Thus, the example XOR circuit 214 will output a '0' when the inputs are in phase (e.g., the second VCO output signal at phase 2 is in phase with the amplified data transmission signal) and output a series of pulses when the inputs are out of phase (e.g., the second VCO output signal at the second phase is not in phase with the amplified data transmission signal).

The example MUX 216 is an integrated circuit that receives multiple inputs and provides an output based on the example select (e.g., control) input 217. The example MUX 216 has a first input, a second input, the select input 217, and an output. n the example fast phase change detection circuit 116, the first input of the MUX 216 receives the error signal of the first example XOR circuit 212 and the error signal of the second example XOR circuit 214. The example MUX 216 outputs the error signal of the first XOR circuit 212 or the error signal of the second XOR circuit 214 based on the logic level of the fast phase change detection signal on the example data output line 118 which is fed back to the example select input 217 of the example MUX 216. For example, if the fast path phase change detection signal on the example data output line 118 corresponds to logic '0' the MUX 216 may output the output signal of the first example XOR circuit 212. In such examples, if the fast path phase change detection signal on the example data output line 118 corresponds to logic '1', the MUX 216 may output the output signal of the second example XOR circuit 214. The output of the MUX 216 is representative of the data associated with the example transmission data signal (e.g., data output signal). The output of the example MUX 216 is filtered by the example low pass filter 218.

The example low pass filter 218 includes the example capacitor 219 to store a binary value associated with the output of the example MUX 216. For example, when the output of the MUX 216 is 0V, nothing is stored in the example capacitor 219. In such an example, the output of the example low pass filter 218 is 0V to represent a binary value of '0.' In some examples, the output of the MUX 216 is a series of pulses when the data signal has a phase shift. In such examples, the pulses are stored in the example capacitor 219 creating a voltage in the example low pass filter 218 that is output by the example low pass filter 218 to represent a binary value of '1.' As further described below, the memory (e.g., voltage) stored in the example capacitor 219 may be discharged by shorting the example low pass filter 218 to ground.

The example amplifier-cum-comparator 220 amplifies the output of the example low pass filter 218 to a voltage that can be processed by another circuit and/or processor and compares with a threshold voltage to declare a "high" or "low" output. The example amplifier-cum-comparator 220 is an electronic amplifier that increases the power of (e.g., provide gain to) the received data transmission signal and compares the amplified input signal to a threshold voltage. The example amplifier-cum-comparator 220 provides an output signal to the example delay circuit 22 and the example T-flip flop 226. Additionally, the data output signal may be processed by another circuit and/or processor. As described above, the transmitter and/or receiver may run a training sequence to determine how the phases of the carrier signal correspond to which data logic level '1' and '0' The output signal of amplifier-cum-comparator 220 is transmitted to the example T-flip flop 226 which is a flip flop connected in divide by 2 configuration. The output of this T flip flop 226 is the data that is detected. Additionally, the output signal of the amplifier-cum-comparator 220 is transmitted to the example delay 222.

The example delay 222 is a device capable of generating a delayed signal based on a received input after a predetermined delay. In the illustrated example, the example delay 222 receives the data output signal and outputs a delayed signal to the example switch 224 to enable and/or disable the example switch 224 after a predetermined delay. The example switch 224 creates a short circuit to ground to discharge the data (e.g., voltage) stored in the example capacitor 219 of the example low pass filter 218 after the data changes from a '1' to '0' or from a '0' to a '1', every time a data transition happens.

The example T-flip flop 226 is a circuit that stores state information (e.g., logic '0' or logic '1'). The illustrated example T-flip flop 226 changes the output on each clock edge of a clock signal. Alternatively it can be a data (D) flip flop connected in divide by 2 configuration. The example T-flip flop 226 switches between the stored state information based on rising edge of a voltage pulse. Alternatively, the example T-flip flop 226 may switch states based on a falling edge and/or any other trigger event. In the illustrated example, the T-flip flop 226 is reset/preset to output a logic value '1' or '0'. Once the T-flip flop 226 receives a rising edge of a voltage pulse (e.g., when a phase change occurs, the amplifier's output voltage changes from logic '1' to '0' or vice versa) and the T flip flop changes state. When the T-flip flop 226 receives the rising edge, the T-flip flop changes the output to the complementary logic value. In such an example, the T-flip flop 226 maintains the logic value of the output until the T-flip flop 226 receives the next edge of the amplifier's output signal. The output of the example T-flip flop 226 represents a fast phase change detection signal that changes logic levels only after a phase change has been detected by the example fast phase change detection circuit 116. The output of the example T-flip flop 226 (e.g., a fast path phase change detection signal) is transmitted to the example select input 205 of the example MUX 204 in the slow PLL loop 110 and the example select input 217 of the example MUX 216.

In operation, an amplified data transmission signal is transmitted to the example PLL 110 and the example fast phase change detection circuit 116 via the example amplified data transmission signal line 108. The PLL 110 outputs two signals (e.g., a first phase signal and a second phase signal)

corresponding to a phase of the received amplified data transmission signal for example in BPSK communication. The two outputted phase signals are fed to the example first and second example XOR gates 212, 214 of the example fast phase change detection circuit 116. Additionally, the two outputted phase signals are fed back to the example phase frequency detectors 200, 202 of the example PLL 110.

When the amplified data transmission signal is transmitted at a first phase, the example PLL 110 will output the first phase signal and the second phase signal When the outputted phase of the PLL is locked to the phase of the data transmission signal, the first phase output signal from the VCO in the PLL loop oscillates with the same phase as that of the data transmission signal and the second phase output signal from the VCO will oscillate with a phase that lags the data transmission signal by the degrees associated with the second phase of the transmitter signal.

The example fast phase change detection circuit 116 receives the locked first VCO output signal at the first phase via the example first phase output line 112 and the second VCO output signal at a second phase via the example second phase output line 114 and the amplified data transmission signal via the example amplified data transmission signal line 108. Because the PLL 110 locks the first VCO output signal at the first phase with the amplified data transmission signal, the two signals oscillate substantially together when the data transmission signal oscillates at a first phase. When the two signals oscillate substantially together, the first example XOR circuit 212 will output logic '0' as the two inputs do not have a phase difference In such examples, initially, the MUX 216 will output logic '0' that is filtered by the example low pass filter 218 and amplified by the example amplifier-cum-comparator 220, as the data select input 217 will be at logic '0' due to the T flip flop that is reset to '0.' The logic '0' output of the amplifier-cum-comparator 220 is fed into the example T-flip flop 226. The example T-flip flop 226 (e.g., which is initialized to output logic '0') will continue to output logic '0' because a rising edge has not yet been received. The example T-flip flop 226 outputs logic '0' example select input 205 of the example MUX 204 in the PLL 110 and the example select input 217 of the example MUX 216 in the example fast phase change detection circuit 116. The low output allows both MUXs 204, 216 to continue to output data associated with the first phase until the data transmission signal changes phase.

When the data transmission signal changes to a second phase, the example PLL 110 will maintain the locked first VCO output signal at the first phase and the second VCO output signal at phase 2. However, the first VCO output signal at the first phase is now out of phase with the data transmission signal and the second VCO output signal at the second phase is now in phase with the data transmission signal. Because the first VCO output signal at a first phase and the data transmission signal are out of phase, the first example XOR 212 will output pulses. The output pulses cause the example low pass filter 218 to output a high voltage which is amplified by the example amplifier-cum-comparator 220, and outputs logic '1' when compared to a threshold voltage. The rising edge of logic '1' makes the example T-flip flop 226 to switch states to logic '1' from logic '0.' This rising edge to logic '1' is also used after a delay to discharge the capacitor 219 in low pass filter 218. As described above, the example T-flip flop 226 maintains logic '1' output until another rising edge is received from the example amplifier-cum-comparator 220 (e.g., due to an next phase change of the data transmission signal). The logic '1' output of the example T-flip flop 226 is transmitted to the example select input 205 of the example MUX 204 and the example select input 217 of the example MUX 216 via the example data output line 118. When the example MUX 204 receives logic '1' via the example data output line 118, the example MUX 204 will output the comparison of the amplified data transmission signal to the VCO output signal at second phase based on the example second phase frequency detector 202. When the example MUX 216 receives the logic '1' via the example data output line 118, the example MUX 216 will output the XOR comparison (e.g., error signal) from the second example XOR circuit 214. Because in the second example XOR circuit 214, since the data transmission signal is now in phase with the VCO output signal at second phase, the error signal of the example XOR circuit 214 will be a logic '0.' In this manner, the example MUX 216 will output logic '0' until the phase of the data transmission signal changes back to the first phase (e.g., causing the error signal of the example XOR circuit 214 to show pulse signals). Thus, the example fast phase change detection circuit 116 acts as a fast phase change detect mechanism that can indicate a phase change to the example PLL 110 and switch to the correct VCO output signal phase so that the slow PLL does not see any change in the control voltage, and hence remain in lock. In this manner, the fast phase change detection circuit 116 and the slow PLL 110 can replace a fast PLL creating high bandwidth data demodulation requiring less power resources than a fast PLL.

Figure 3:
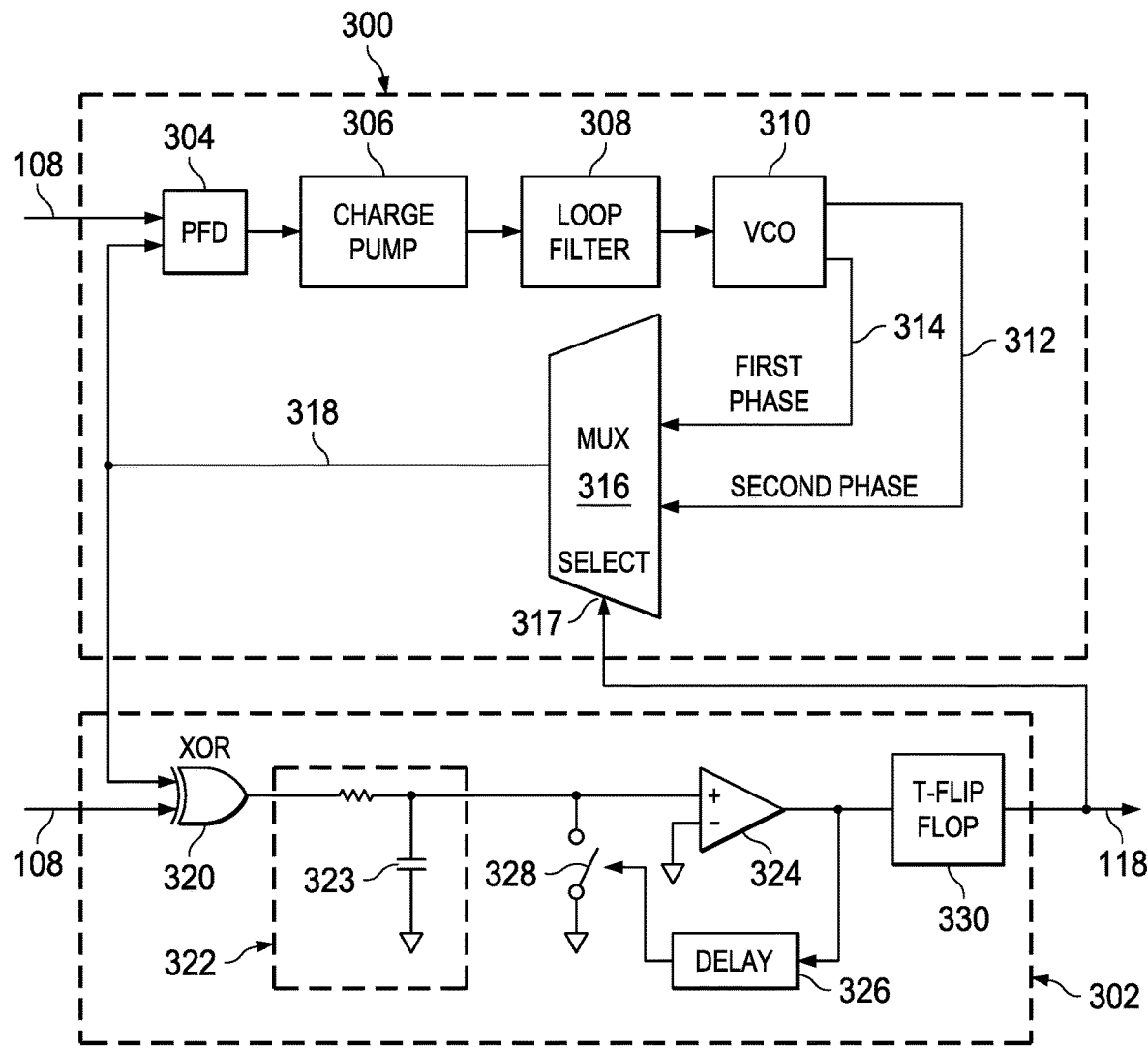
FIG. 3 is a circuit structure of an alternative implementation example of the high speed demodulation scheme which includes the slow phase-lock loop and an alternative example of the fast phase change detection circuit that may be implemented in the example receiver of FIG. 1.

FIG. 3 is an alternative example circuit structure to implement the example PLL 110 and the example fast phase change detection circuit 116 of FIG. 1. In the illustrated example of FIG. 3, the example PLL 110 is alternatively represented by an example PLL 300 and the example fast phase change detection circuit 116 is alternatively represented by the example fast phase change detection circuit 302. The example PLL 300 includes an example phase frequency detector 304, an example charge pump 306, an example loop filter 308, an example voltage controlled oscillator 310, an example VCO output signal at second phase line 312, an example VCO output signal at first phase line 314, an example MUX 316, and an example select input 317, an example VCO output signal line 318. The example fast phase change detection circuit 302 includes an example XOR circuit 320, an example low pass filter 322, an example capacitor 323, an example amplifier-cum-comparator 324, an example delay circuit 326, an example switch 328, and an example T-flip flop 330.

The example PLL 300 receives an amplified data transmission signal via the example amplified data transmission line 108 and outputs a VCO output signal which matches the phase of the received amplified data transmission signal when in lock via the example phase output line 318. In some examples, the VCO output signal phase is a first phase. In some examples, the VCO output signal is at the second phase. The phase of the VCO output signal on line 318 depends on the logic level received by the example select input 317 of the example MUX 316. For example, when the logic level received by the example select input 317 is logic '0,' the VCO output signal at the first phase output on the example phase output line 318. Additionally, when the logic level received by the example select input 317 is logic '1,' the VCO output signal at the second phase may be output on the example phase output line 318. The logic level received by the example select input 317 corresponds to the output of the example T-flip flop 330 of the example fast phase change detection circuit 302

The example XOR circuit 320 of the example fast phase change detection circuit 302 compares the amplified data transmission signal via the example amplified data transmission signal line 108 with the example VCO output signal at either the first phase or the second phase on line 318 from PLL 300. When the amplified data transmission signal oscillates at a first phase, the VCO output signal at the first phase will be output by the example PLL 300 and because the VCO output signal at the first phase of the PLL 300 is locked with the amplified data transmission signal, the output of the example XOR 320 will be at logic '0' The XOR output pulses at logic '0' will be filtered by the example low pass filter 322, and amplified and compared to a threshold voltage by the example amplifier-cum-comparator 324, and transmitted to the example select input 317 of the example MUX 316 which will continue to output the VCO output signal at the first phase. This VCO output signal is used for comparison with the data transmission signal by the example fast phase change detection circuit 302.

When the phase of the data transmission signal changes, the VCO output signal at the first phase and the data transmission signal will no longer be in phase. At that moment, the example XOR circuit 320 of the example fast phase change detection circuit 302 will output pulses oscillating between logic '1' and logic '0' because the VCO output signal at phase 1 and the amplified data transmission signal are no longer in phase. The pulses output by the XOR circuit 320 are filtered by the example low pass filter 322 to create a high voltage output stored in the example capacitor 323. The high voltage output from the low pass filter 322 is amplified and compared to a threshold voltage by the example amplifier-cum-comparator 324 and transmitted to the example delay 326 and the example T-flip flop 330. The example T-flip flop 330 changes states based on a rising edge of a pulse associated with a phase change of the example data transmission signal. A change in state output by the example T-flip flop 330 is transmitted to the example select input 317 of the example MUX 316 to change the VCO output signal to the second phase of the example PLL 300. In such an example, the VCO output signal at phase 2 outputted to the example fast phase change detection circuit 302. Because the VCO output signal at phase 2 is out of phase with the amplified data transmission signal, the XOR circuit 320 outputs pulse signals which when filtered and compared to a threshold voltage represent a binary value of '1' until the data transmission signal changes back to the first phase. In some examples, the output signal from the amplifier-cum-comparator 324 is received by the example delay 326 to discharge the example capacitor 323 of the example low pass filter 322 after a predetermined delay. Although the example PLL 300 and the example fast phase change detection circuit 302 is described in conjunction with two phases (e.g., zero degree and ninety degree, for example) any number of phases may be utilized based on the data rate and features that need to be addressed by the PSK communication.

While example manners of implementing the example PLLs 110, 300 and the example fast phase change detection circuit 116, 302 are illustrated in FIGS. 2 and 3, elements, processes and/or devices illustrated in FIGS. 2 and 3 may be combined, divided, re-arranged, omitted, eliminated and/or implemented in any other way. Further, the example phase frequency detectors 200, 202, 304, the example MUXs 204, 216, 316, the example charge pumps 206, 306, the example loop filters 208, 308, the example voltage controlled oscillators 210, 310, the example XOR circuits 212, 214, 320, the example low pass filters 218, 322, the example amplifier cum comparators 220, 324, the example delays 222, 326, the example T-flip flops 226, 330, and/or, more generally, the example PLLs 110, 300 and/or the example fast phase change detection circuits 116, 302 of FIGS. 2 and 3, may be implemented by hardware, machine readable instructions, software, firmware and/or any combination of hardware, machine readable instructions, software and/or firmware. Thus, for example, any of the example phase frequency detectors 200, 202, 304, the example MUXs 204, 216, 316, the example charge pumps 206, 306, the example loop filters 208, 308, the example voltage controlled oscillators 210, 310, the example XOR circuits 212, 214, 320, the example low pass filters 218, 322, the example amplifiers 220, 324, the example delays 222, 326, the example T-flip flops 226, 330, and/or, more generally, the example PLLs 110, 300 and/or the example fast phase change detection circuits 116, 302 of FIGS. 2 and 3, could be implemented by analog and/or digital circuit(s), logic circuit(s), programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example phase frequency detectors 200, 202, 304, the example MUXs 204, 216, 316, the example charge pumps 206, 306, the example loop filters 208, 308, the example voltage controlled oscillators 210, 310, the example XOR circuits 212, 214, 320, the example low pass filters 218, 322, the example amplifiers 220, 324, the example delays 222, 326, the example T-flip flops 226, 330, and/or, more generally, the example PLLs 110, 300 and/or the example fast phase change detection circuits 116, 302 of FIGS. 2 and 3, is/are hereby expressly defined to include a tangible computer readable storage device or storage disk such as a memory, a digital versatile disk (DVD), a compact disk (CD), a Blu-ray disk, etc. storing the software and/or firmware. Further still, the example PLLs 110, 300 and/or the example fast phase change detection circuits 116, 302 of FIGS. 2 and 3 include elements, processes and/or devices in addition to, or instead of, those illustrated in FIGS. 2 and 3, and/or may include more than one of any or all of the illustrated elements, processes and devices.

Figure 4:
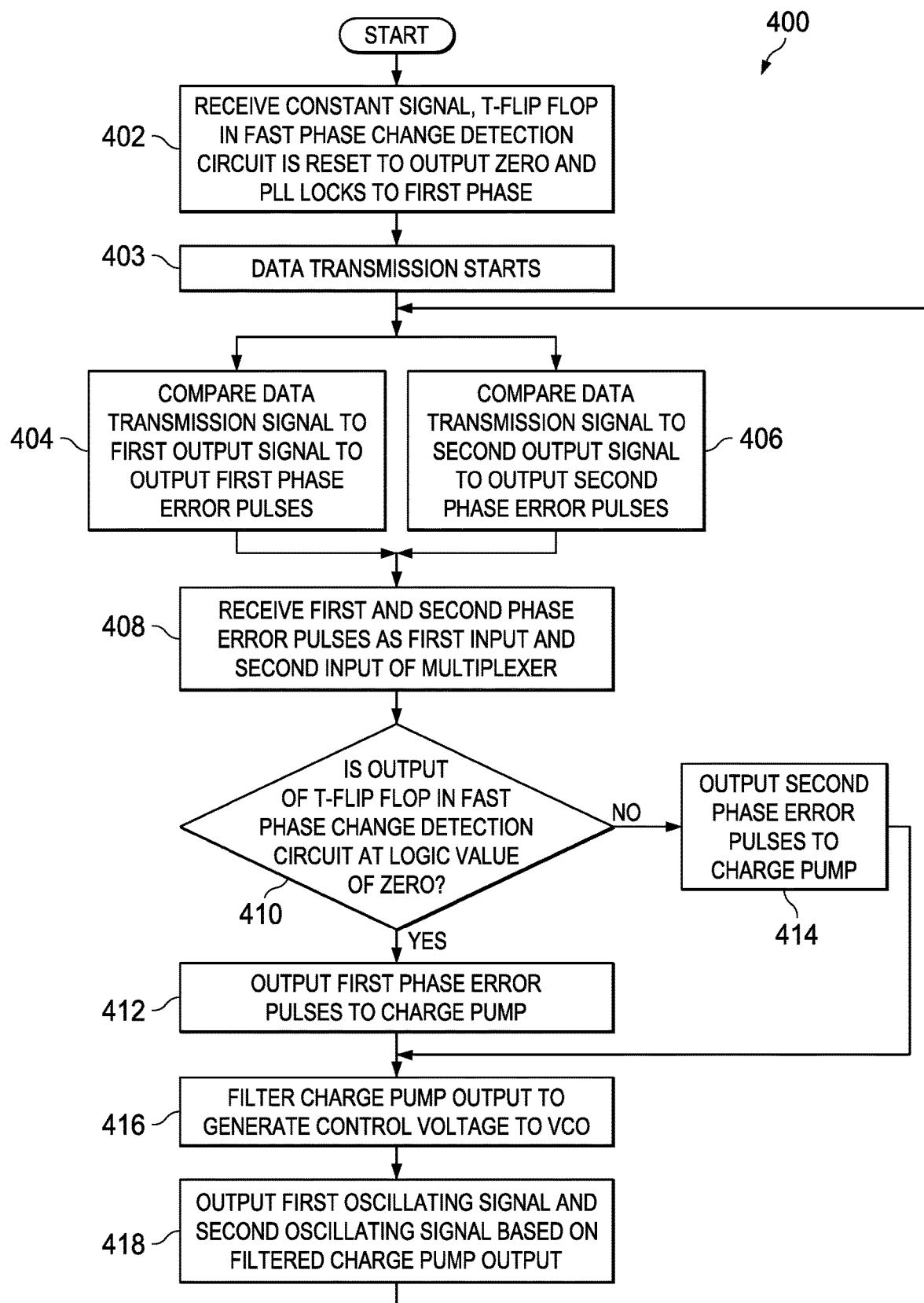
FIG. 4 is a flowchart representative of example machine readable instructions that may be executed to implement the example phase-lock loop of FIG. 2 to lock a received data transmission signal based on the output of the fast phase change detection circuit of FIG. 2.
Figure 5:
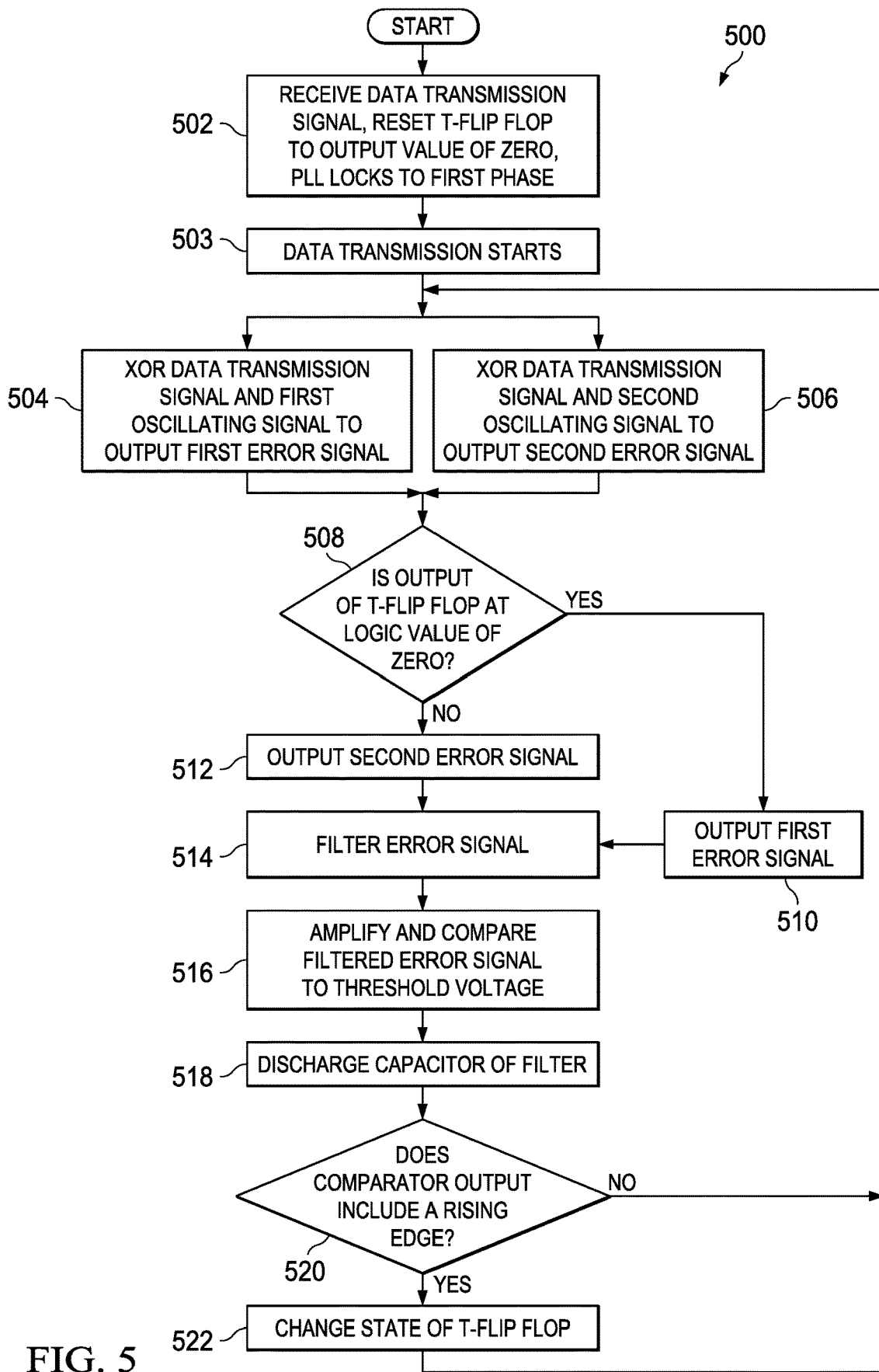
FIG. 5 is a flowchart representative of example machine readable instructions that may be executed to implement the example fast phase change detection circuit of FIG. 2 to provide a fast path which identifies a phase change of the received data transmission signal of FIG. 2.
Figure 6:
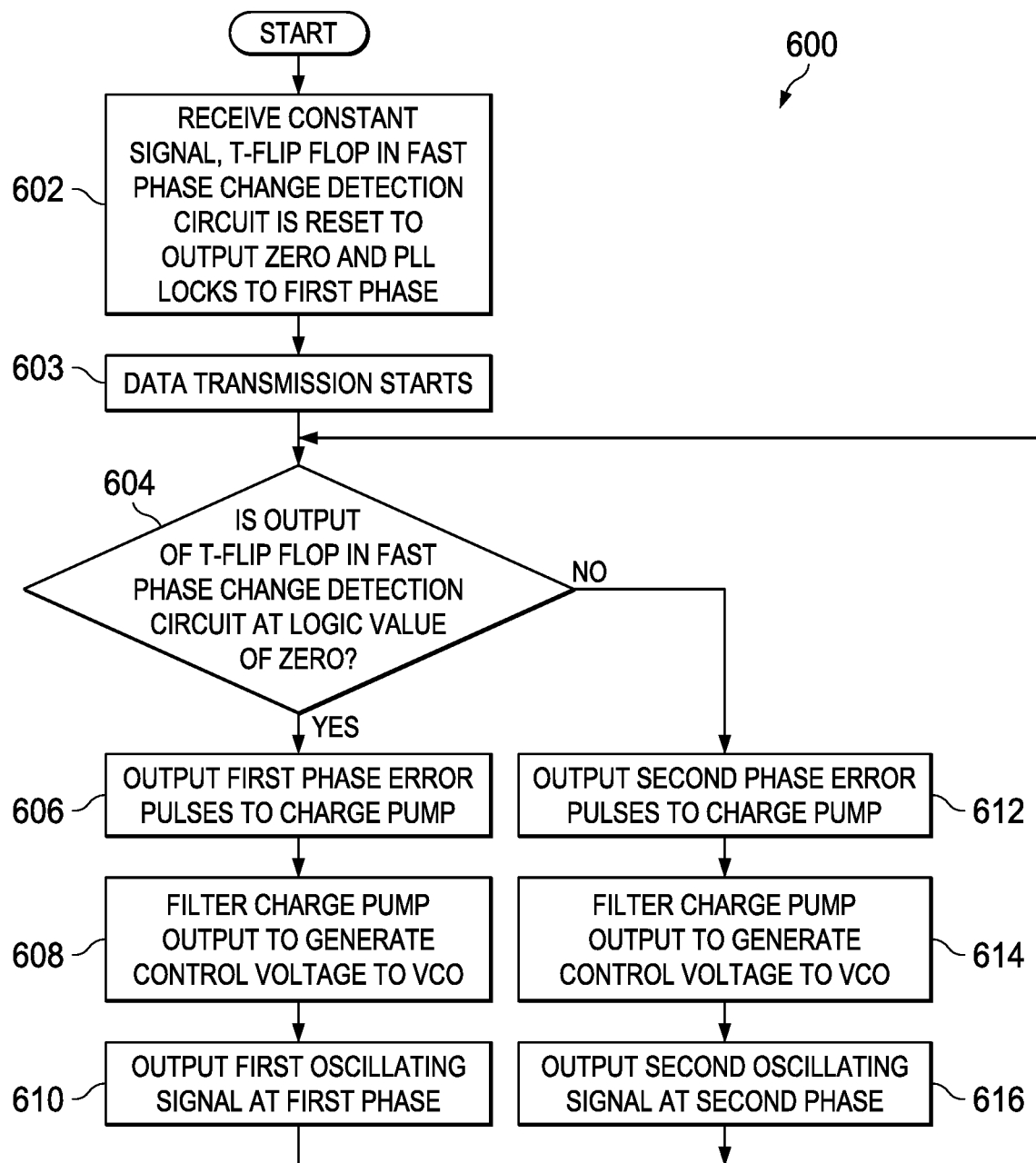
FIG. 6 is a flowchart representative of example machine readable instructions that may be executed to implement the alternative example pixel depth determiner of FIG. 3 to lock a received data transmission signal based on a fast phase change detection circuit shown of FIG. 3.
Figure 7:
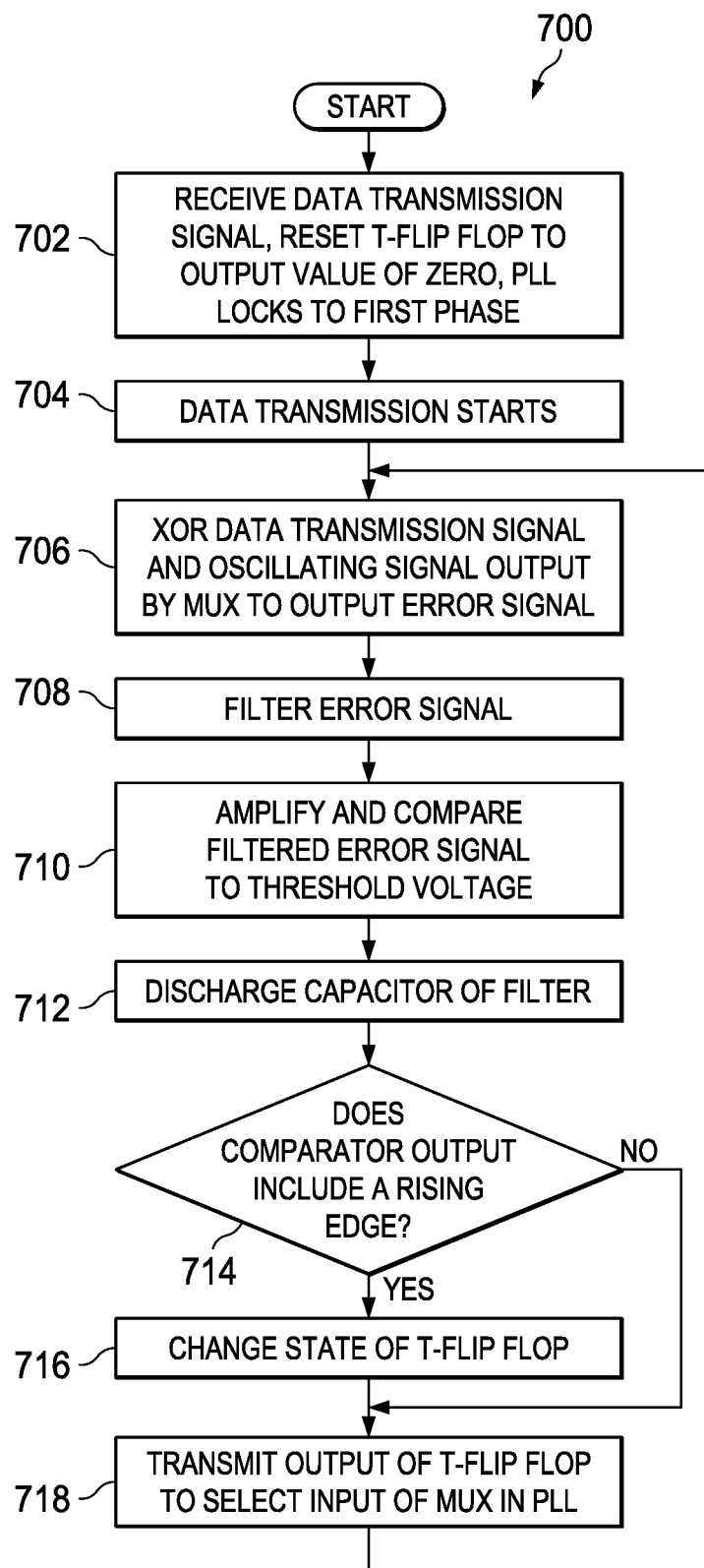
FIG. 7 is a flowchart representative of example machine readable instructions that may be executed to implement the alternative example fast phase change detection circuit of FIG. 3 to provide a fast path which identifies a phase change of the received data transmission signal of FIG. 3.

Flowcharts representative of example machine readable instructions for implementing the example PLLs 110, 300 of FIGS. 2 and 3 is shown in FIGS. 4 and 6 and flowcharts representative of example machine readable instructions for implementing the example fast phase change detection circuits 116, 302 of FIGS. 2 and 3 are shown in FIGS. 5 and 7. In the examples, the machine readable instructions comprise a program for execution by a processor such as the processor 812 shown in the example processor platform 800 discussed below in connection with FIG. 8. The program may be embodied in machine readable instructions stored on a tangible computer readable storage medium such as a CD-ROM, a floppy disk, a hard drive, a digital versatile disk (DVD), a Blu-ray disk, or a memory associated with the processor 812, but the entire program and/or parts thereof could alternatively be executed by a device other than the processor 812 and/or embodied in firmware or dedicated hardware. Further, although the example program is described with reference to the flowcharts illustrated in FIGS. 4-7, many other methods of implementing the example PLLs 110, 300 and/or the example fast phase change detection circuits 116, 302 may alternatively be used. For example, the order of execution of the blocks may be changed, and/or some of the blocks described may be changed, eliminated, or combined.

As mentioned above, the example process of FIG. 4-7 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example process of FIG. 4-7 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 4 is an example flowchart 400 representative of example machine readable instructions that may be executed by the example PLL 110 of FIG. 2 to provide a PLL that locks to a data transmission signal at a first phase or a second phase. Although the flowchart 400 is described in conjunction with the example PLL 110 of FIG. 2, the flowchart 400 used to implement any type of PLL.

At block 402, the example PLL 110 receives a constant signal, the example T-flip flop 226 in the example fast phase change detection circuit 116 is reset to output the digital value of '0,' and the VCO of the example PLL 110 output signal at the first phase is the signal that keeps the PLL 110 in lock. The example phase frequency detectors 200, 202 of the PLL 110 receive data transmission signal (e.g., an amplified data transmission signal) from the example transmitter 100 of FIG. 1. At block 403, the data transmission begins. At block 404, the first phase frequency detector 200 compares the received data transmission signal to a VCO output signal at a first phase that is generated by the example voltage controlled oscillator 210 to output first error pulses associated with a difference between the data transmission signal and a VCO output signal at the first phase. At block 406, the second phase frequency detector 202 compares the received data transmission signal to a VCO output signal at a second phase that is generated by the example voltage controlled oscillator 210 to output second error pulses associated with a difference between the data transmission signal and a VCO output signal at the second phase.

At block 408, the example MUX 204 receives the first and second error pulses as a first input and a second input, respectively. At block 410, the example MUX 204, based on the output of the example T flip flop 226 in fast phase change detection circuit 116, outputs first phase error pulses to charge pump or second phase error pulses to charge pump. Thus, if a phase change is detected, the example fast path phase change detection signal from the T flip flop 226 will send the other input of the MUX 204 on the output line of the MUX.

If the fast path phase change detection signal output by the example T-flip flop 226 in the example fast phase change detection circuit 116 is associated with a logic value of '0,' the example MUX 204 outputs the first phase error pulses (e.g., corresponding to the VCO output signal at the first phase) to the example charge pump 206 (block 412). If the fast path phase change detection signal output by the example T-flip flop 226 in the example fast phase change detection circuit 116 is associated with a logic value of '1,' the example MUX 204 outputs the second phase error pulses (e.g., corresponding to the VCO output signal at the second phase) to the example charge pump 206 (block 414). In some examples, the first or second phase pulses are received by the example charge pump 206 and filtered by example loop filter 208 to output a DC voltage corresponding to the phase difference. At block 416, the example loop filter 208 filters the output of the example charge pump 208 to generate a control voltage for the example oscillator 210.

At block 418, the example voltage controlled oscillator 210 outputs a first oscillating signal (e.g., the VCO output signal at the first phase) and a second oscillating signal (e.g., the VCO output signal at the second phase) based on the filtered charge pump output (e.g., which corresponds to the DC voltage output by the example loop filter 208). As described above in conjunction with FIG. 2, the example MUX 204 outputs the same phase error pulses (e.g., corresponding to the first phase or the second phase) until the select input 205 receives a new logic level due to a phase change detection identified by the example fast phase change detection circuit 116.

FIG. 5 is an example flowchart 500 representative of example machine readable instructions that may be executed by the example fast phase change detection circuit 116 of FIG. 2 to provide a fast path phase change detection and generate the demodulated data transmission signal. Initially, at start the example flip flop 226 is reset to a value of '0.' Although the flowchart 500 is described in conjunction with the example fast phase change detection circuit 116 of FIG. 2, the flowchart 500 may be used to implement any type of fast phase change detection circuit. Initially, prior to receiving a data transmission signal from a transmitter 100, At block 502, the first and second example XOR circuits 212, 214 receive a data transmission signal, the example T flip flop 226 resets to output a value of '0,' and the PLL is in lock to start with to the phase of the incoming data transmission signal. The VCO in the locked PLL outputs first oscillating signal at a first phase and second oscillating signal at a second phase. At block 503, the data transmission begins. At block 504, the first example XOR circuit 212 exclusive ors the data transmission signal with a first oscillating signal (e.g., VCO output signal at phase 1 via the example first phase output line 112) to output first error pulses. As described in conjunction with FIG. 2, when the data transmission signal and the first phase oscillating signal are in phase, the first error signal will be '0.' Additionally, when the data transmission signal and the first phase oscillating signal are out of phase, the first error signal will be a series of logic pulses. At block 506, the second example XOR circuit 214 exclusive ors the data transmission signal with a second oscillating signal (e.g., the VCO output signal at the second phase via the example second phase output line 114) to output a second error pulses. As described in conjunction with FIG. 2, when the data transmission signal and the second phase oscillating signal are in phase, the second error signal will be at logic '0.' Additionally, when the data transmission signal and the second phase oscillating signal are out of phase, the second error signal will be a series of logic pulses. The first and second error signals are transmitted to the example MUX 216.

At block 508, the example MUX 216 determines which input should be given as output based on the output of the example T-flip flop 226. As described above in conjunction with FIG. 2, if the first phase of the example data transmission signal changes to a second phase, the output of the first or second example XOR circuit 212, 214 pulses from a logic '0' to a logic '1' triggering the example T-flip flop 226 to change the logic state (e.g., from high to low or from low to high). This signal on the example data output line 118 is also fed back (e.g., via the example select input 217) to the example MUX 216 to, in return, to either hold the state of the T flip flop or to switch output (e.g., the output of the first XOR circuit 212 or the output of the second XOR circuit 24) of the example MUX 216.

If the example MUX 216 has determined that the output of the example T-flip flop 226 is a logic value of '0,' the MUX 216 outputs the first error signal corresponding to the output of the first XOR circuit 212 (block 510). If the example MUX 216 has determined that the output of the example T-flip flop 226 is not a logic value of '1,' the MUX 216 outputs the second error signal corresponding to the output of the second XOR circuit 214 (block 512). At block 514, the example low pass filter 218 filters the error signal outputted by the example MUX 216. At block 516, the example amplifier-cum-comparator 220 amplifies the filtered error signal and compares the filtered error signal to a threshold voltage to declare logic high or logic low.

At block 518, after a predetermined delay by the example delay 222, the example switch 224 is turned on to discharge the example capacitor 219 of the example low pass filter 218. As described above, the discharging of the example capacitor 219 clears the voltage stored in the example capacitor 219 from a previous output.

At block 520, the example T-flip flop 226 receives the comparator output and checks if there is a rising edge on the input which is associated with a phase change of the amplified data transmission signal. As described above in conjunction with FIG. 2, when a phase change occurs, the output of the example XOR circuit change from logic '0' to logic pulses (e.g., when the data transmission signal changes from in phase to out of phase of the locked VCO output signal). The phase difference error is filtered by the low pass filter 218 and compared to a threshold voltage by the amplifier-cum-comparator 220, the rising edge of the comparator output signifies a phase change detection from previous phase of the data transmission signal. If the example T-flip flop 226 determines that the amplified filtered error signal does not include a rising edge, the example T-flip flop 226 determines that a phase change has not occurred and the continues to hold the state and the process continues. If the example T-flip flop 226 determines that the comparator output does include a rising edge, the example T-flip flop 226 changes the state of the fast path phase change detection signal (e.g. from a logic '0' to logic '1' or vice versa (block 522). Additionally, the fast path phase change detection signal is transmitted to the example MUXs 204, 216 to flag the phase change of the data transmission signal. As described above in conjunction with FIG. 2, the example fast phase change detection circuit 116 continues processing the received data transmission signal to detect phase changes in the data transmission signal.

FIG. 6 is an example flowchart 600 representative of example machine readable instructions that may be executed by the example PLL 300 of FIG. 3 to provide a PLL corresponding to a data transmission signal using either a first phase or a second phase. Although the flowchart 600 is described in conjunction with the example PLL 300 of FIG. 3, the flowchart 600 used to implement any type of PLL.

At block 602, the example phase frequency detector 304 receives a constant signal (e.g., an amplified data transmission signal) from the example transmitter 100 of FIG. 1, the example T-flip flop 330 in the example fast phase change detection circuit 302 is reset to output a logic value of '0,' and the PLL 300 locks to the first phase. The example T-flip flop 330 in the example fast path phase change detection circuit 116 is reset to output the digital value of '0' and the example PLL 110 is locked with the VCO output signal at first phase. As described above in conjunction with FIG. 3, the phase frequency detector 304 compares the received data transmission signal with either a VCO output signal at first phase or a VCO output signal at the second phase output depending on the data output signal on the example data output line 118 which is fed into the example select input 317 of the example MUX 316 via the example T-flip flop 330. At block 603, data transmission begins.

At block 604, the example MUX 316 determines if the output of the example T-flip flop 330 in the fast phase change detection circuit 302 is a logic value of zero. If the output of the example T-flip flop 330 in the fast phase change detection circuit 302 is a logic value of zero, the example phase frequency detector 304 compares a first oscillating signal at a first phase via the example MUX 316 (e.g., a zero degree phase signal) via the example first phase output line 314 with the received data transmission signal to output first error pulses to the example charge pump 306 (block 606). At block 608, the example loop filter 308 filters charge pump output to generate a control voltage to the example oscillator 310. As described above in conjunction with FIG. 3, the oscillator 310 outputs (a) the first oscillating signal at the first phase and (b) the second oscillating signal and the second phase based on the control voltage. At block 610, the example MUX 316 continues to output the first oscillating signal to the example phase frequency detector 304 and the example fast phase change detection circuit 302 until the output of the example fast phase change detection circuit changes states.

If the output of the example T-flip flop 330 in the fast phase change detection circuit 302 is not a logic value of zero (e.g., '1'), the example phase frequency detector 304 compares a second oscillating signal at a second phase via the example MUX 316 (e.g., a ninety degree phase signal) via the example second phase output line 312 with the received data transmission signal to output second error pulses to the example charge pump 306 (block 612). At block 614, the example loop filter 308 filters charge pump output to generate a control voltage to the example oscillator 310. As described above in conjunction with FIG. 3, the oscillator 310 outputs (a) the first oscillating signal at the first phase and (b) the second oscillating signal and the second phase based on the control voltage to the example MUX 316. At block 616, the example MUX 316 continues to output the second oscillating signal to the example phase frequency detector 304 and the example fast phase change detection circuit 302 until the output of the example fast phase change detection circuit changes states.

FIG. 7 is an example flowchart 700 representative of example machine readable instructions that may be executed by the example fast phase change detection circuit 302 of FIG. 3 to provide fast phase change detection and demodulate the data transmission signal. Although the flowchart 700 is described in conjunction with the example fast phase change detection circuit 302 of FIG. 3, the flowchart 700 may be used to implement any type of fast phase change detection circuit 3.

At block 702, the example fast phase change detection circuit (e.g., the example XOR circuit 320) receives a data transmission signal, the example T-flip flop 330 is reset to output a logic value of '0,' and the example PLL 300 locks to the first phase. At block 704, data transmission begins. At block 706, the example XOR circuit 320 exclusive ors the data transmission signal with the VCO oscillating signal output available at the output of example MUX 316 to output an error signal based on the phase difference. As described above, the output of the example XOR circuit 320 (e.g., the error signal) is logic '0' when the data transmission signal is in phase with the VCO oscillating output signal available at the output of the example MUX 316. Additionally, the error signal is a series of logic pulses when the data transmission signal is out of phase with the VCO oscillating signal output available at the output of the example MUX 316. At block 706, the example low pass filter 322 filters the error signal. At block 710, the example amplifier-cum-comparator 324 amplifies the filtered error signal and compares the filtered error signal to a threshold voltage and declares a logic '1' or logic '0' at the output of the comparator.

At block 712, after a predetermined delay by the example delay 326, the example switch 328 is turned on to discharge the example capacitor 323 of the example low pass filter 322. As described above, the discharging of the example capacitor 323 clears the voltage stored in the example capacitor 323 from a previous output. At block 714, the example T-flip flop 330 receives comparator output and if it includes a rising edge on the input, the state of the T flip-flop 330 changes signifying a phase change of the amplified data transmission signal. As described above in conjunction with FIG. 3, when a phase change occurs, the output of the example XOR circuit 320 change from logic '0' to a series of logic pulses (e.g., when the data transmission signal changes from in phase to out of phase). The logic pulses when filtered by low pass filter 322, amplified and compared to a threshold correspond to a rising edge from a logic '0' to logic '1' signifying a phase change detection. If the example T-flip flop 330 determines that the amplified filtered error signal includes a rising edge, the example T-flip flop 330 changes the output state (e.g., from a high voltage to a low voltage or from a low voltage to a high voltage) (block 716).

At block 718, the example amplifier-cum-comparator 324 transmits the output of the example T-flip flop 330 to the example select input 317 of the example MUX 316 in the example PLL 300. As described above in conjunction with FIG. 3, the example fast phase change detection circuit 302 continues processing the received data transmission signal to detect phase changes in the data transmission signal.

Figure 8:
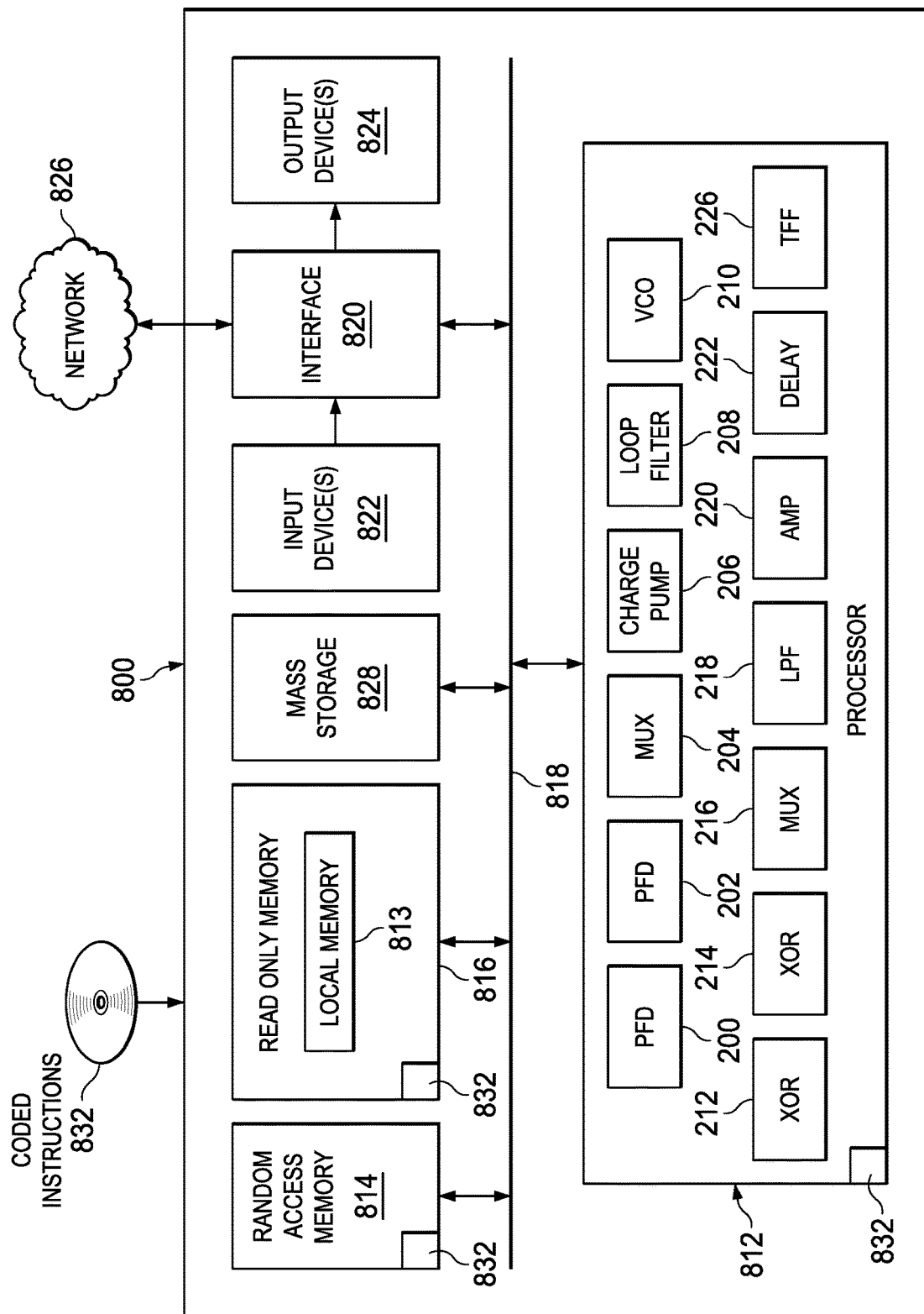
FIG. 8 is a block diagram of an example processor platform that may be utilized to execute the example instructions of FIGS. 4 and 5 to implement the example phase-lock loop and the example fast phase change detection circuit of FIG. 2.

FIG. 8 is a block diagram of an example processor platform 800 capable of executing the instructions of FIG. 3 to implement the example PLL 110 and the example fast phase change detection circuit 116 of FIG. 2. The processor platform 800 can be, for example, a server, a personal computer, a mobile device (e.g., a cell phone, a smart phone, a tablet such as an iPad™), a personal digital assistant (PDA), an Internet appliance, or any other type of computing device.

The processor platform 800 of the illustrated example includes a processor 812. The processor 812 of the illustrated example is hardware. For example, the processor 812 can be implemented by integrated circuits, logic circuits, microprocessors or controllers from any desired family or manufacturer.

The processor 812 of the illustrated example includes a local memory 813 (e.g., a cache). The example processor 812 of FIG. 8 executes the instructions of FIG. 4-5 to implement the example phase frequency detectors 200, 202, the example MUX 204, the example charge pump 206, the example loop filter 208, and/or the example voltage controlled oscillator 210 of FIG. 2 to implement the example the example PLL 110 and the example XOR circuits 212, 214, the example MUX 216, the example low pass filter 218, the example amplifier-cum-comparator 220, the example delay 222, and/or the example T-flip flop 226 of FIG. 2 to implement the example fast phase change detection circuit 116. The processor 812 of the illustrated example is in communication with a main memory including a volatile memory 814 and a non-volatile memory 816 via a bus 818. The volatile memory 814 may be implemented by Synchronous Dynamic Random Access Memory (SDRAM), Dynamic Random Access Memory (DRAM), RAIVIBUS Dynamic Random Access Memory (RDRAM) and/or any other type of random access memory device. The non-volatile memory 816 may be implemented by flash memory and/or any other desired type of memory device. Access to the main memory 814, 816 is controlled by a clock controller.

The processor platform 800 of the illustrated example also includes an interface circuit 820. The interface circuit 820 may be implemented by any type of interface standard, such as an Ethernet interface, a universal serial bus (USB), and/or a PCI express interface.

In the illustrated example, one or more input devices 822 are connected to the interface circuit 820. The input device(s) 822 permit(s) a user to enter data and commands into the processor 812. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 820 of the illustrated example, thus, typically includes a graphics driver card, a graphics driver chip or a graphics driver processor.

The interface circuit 820 of the illustrated example also includes a communication device such as a transmitter, a receiver, a transceiver, a modem and/or network interface card to facilitate exchange of data with external machines (e.g., computing devices of any kind) via a network 826 (e.g., an Ethernet connection, a digital subscriber line (DSL), a telephone line, coaxial cable, a cellular telephone system, etc.).

The processor platform 800 of the illustrated example also includes one or more mass storage devices 828 for storing software and/or data. Examples of such mass storage devices 828 include floppy disk drives, hard drive disks, compact disk drives, Blu-ray disk drives, RAID systems, and digital versatile disk (DVD) drives.

The coded instructions 832 of FIG. 8 may be stored in the mass storage device 828, in the volatile memory 814, in the non-volatile memory 816, and/or on a removable tangible computer readable storage medium such as a CD or DVD.

Figure 9:
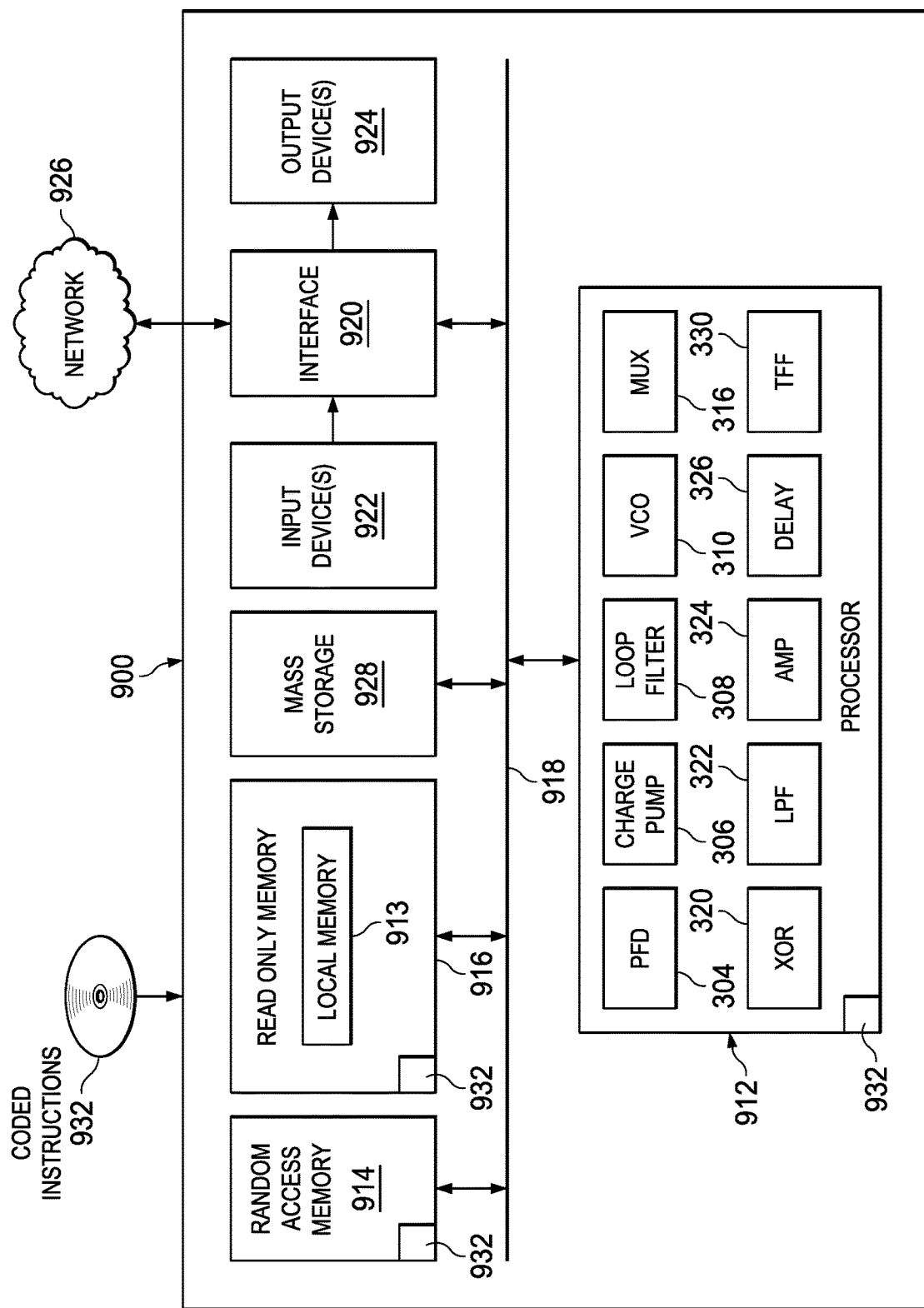
FIG. 9 is a block diagram of an example processor platform that may be utilized to execute the example instructions of FIGS. 6 and 7 to implement the alternative example phase-lock loop and the alternative example fast phase change detection circuit of FIG. 3.

FIG. 9 is a block diagram of an example processor platform 900 capable of executing the instructions of FIG. 3 to implement the example PLL 300 and the example fast phase change detection circuit 302 of FIG. 3. The processor platform 900 can be, for example, a server, a personal computer, a mobile device (e.g., a cell phone, a smart phone, a tablet such as an iPad™), a personal digital assistant (PDA), an Internet appliance, or any other type of computing device.

The processor platform 900 of the illustrated example includes a processor 912. The processor 912 of the illustrated example is hardware. For example, the processor 912 can be implemented by integrated circuits, logic circuits, microprocessors or controllers from any desired family or manufacturer.

The processor 912 of the illustrated example includes a local memory 913 (e.g., a cache). The example processor 912 of FIG. 9 executes the instructions of FIG. 6-7 to implement the example phase frequency detector 304, the example charge pump 306, the example loop filter 308, the example voltage controlled oscillator 310, and/or the example MUX 316 of FIG. 3 to implement the example the example PLL 300 and the example XOR circuit 320, the example low pass filter 322, the example amplifier-cum-comparator 324, the example delay 326, and/or the example T-flip flop 330 of FIG. 3 to implement the example fast phase change detection circuit 302. The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAIVIBUS Dynamic Random Access Memory (RDRAM) and/or any other type of random access memory device. The non-volatile memory 916 may be implemented by flash memory and/or any other desired type of memory device. Access to the main memory 914, 916 is controlled by a clock controller.

The processor platform 900 of the illustrated example also includes an interface circuit 920. The interface circuit 920 may be implemented by any type of interface standard, such as an Ethernet interface, a universal serial bus (USB), and/or a PCI express interface.

In the illustrated example, one or more input devices 922 are connected to the interface circuit 920. The input device(s) 922 permit(s) a user to enter data and commands into the processor 912. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 920 of the illustrated example, thus, typically includes a graphics driver card, a graphics driver chip or a graphics driver processor.

The interface circuit 920 of the illustrated example also includes a communication device such as a transmitter, a receiver, a transceiver, a modem and/or network interface card to facilitate exchange of data with external machines (e.g., computing devices of any kind) via a network 926 (e.g., an Ethernet connection, a digital subscriber line (DSL), a telephone line, coaxial cable, a cellular telephone system, etc.).

The processor platform 900 of the illustrated example also includes one or more mass storage devices 928 for storing software and/or data. Examples of such mass storage devices 928 include floppy disk drives, hard drive disks, compact disk drives, Blu-ray disk drives, RAID systems, and digital versatile disk (DVD) drives.

The coded instructions 932 of FIG. 9 may be stored in the mass storage device 928, in the volatile memory 914, in the non-volatile memory 916, and/or on a removable tangible computer readable storage medium such as a CD or DVD.

From the foregoing, it would be appreciated that the above disclosed method, apparatus, and articles of manufacture provide high rate demodulation using a slow PLL and a fast phase change detection circuit. High rate demodulation has conventionally been accomplished using fast (e.g., high bandwidth) PLLs. However, conventional high bandwidth PLLs are more complex, more expensive, and uses a lot of power. Examples disclosed herein utilize a slow PLL and a fast phase change detection circuit to provide high rate demodulation without the complexity, expense, and power required by conventional PLLs. Using examples disclosed herein the slow PLL outputs oscillating signals of various phases corresponding to a phase of a receiver data transmission signal and the fast phase change detection circuit provides a fast phase change detection to determine which oscillating signal to utilize with the received data transmission signal. For example, the slow PLL locks multiple signals corresponding to the multiple phases associated with a carrier wave (e.g., the data transmission signal), one of the multiple phases being used in a feedback loop of the PLL. Using examples disclosed herein, a fast phase change detection circuit provides a fast phase change detection to identify which one of the multiple locked signals should be fed back in the PLL. Using examples disclosed herein, data can be demodulated at over 100 Megabits per second without the cost, complexity, and power consumption associated with fast PLLs.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

What is claimed is:

1. An apparatus comprising:
    a first bandwidth phase lock loop with a first input adapted to be coupled to a data signal generator, a second input, a first output, and a second output;
    a fast phase change detection circuit having a first input, a second input, and an output, the first input is coupled to the first output of the first bandwidth phase lock loop, and the second input is coupled to the second output of the first bandwidth phase lock loop, the fast phase change detection circuit is configured to:
        generate a fast phase change detection signal by comparing a first signal at the first input and a second signal at the second input;

output, at the first output of the fast phase change detection circuit, the fast phase change detection signal.

2. The apparatus of claim 1, wherein the first bandwidth phase lock loop includes:
a first phase frequency detector to (A) receive the data signal and the first output signal and (B) output a first pulse signal corresponding to a first phase difference between the data signal and the first output signal;
a second phase frequency detector to (A) receive the data signal and the second output signal and (B) output a second pulse signal corresponding to a second phase difference between the data signal and the second output signal, the first output signal oscillating at the first phase and the second output signal oscillating at the second phase;
a voltage controlled oscillator to output the first output signal and the second output signal; and
a first multiplexer to use the output of the fast phase change detection circuit as a first select signal and output the first pulse signal or the second pulse signal based on the first select signal, the output of the first multiplexer being used in the feedback loop of the first bandwidth phase lock loop.

3. The apparatus of claim 2, wherein the first multiplexer is structured to receive the first pulse signal and the second pulse signal.

4. The apparatus of claim 2, wherein the first multiplexer is structured to:
output the first pulse signal when the output of the fast phase change detection circuit is the first logic value; and
output the second pulse signal when the output of the fast phase change detection circuit is the second logic value.

5. The apparatus of claim 2, wherein the voltage controlled oscillator is structured to output the first output signal or the second output signal based on the output of the first multiplexer.

6. A method comprising:
receiving, by a first bandwidth phase lock loop, a data signal at a first phase;
outputting, by a first output of the first bandwidth phase lock loop, a first output signal at the first phase;
outputting, by a second output of the first bandwidth phase lock loop, a second output signal at the second phase;
generating, by a fast phase change detection circuit, a fast phase change detection signal based on a comparison of the first output signal and the second output signal; and
transmitting, from the fast phase change detection circuit to the first bandwidth phase lock loop, the fast phase change detection signal.

7. The method of claim 6, wherein the first bandwidth phase lock loop includes:
receiving, by a first phase frequency detector, the data signal and the first output signal;
outputting, by the first phase frequency detector, a first pulse signal corresponding to a first phase difference between the data signal and the first output signal;
receiving, by a second phase frequency detector, the data signal and the second output signal;
outputting, by the second phase frequency detector, a second pulse signal corresponding to a second phase difference between the data signal and the second output signal, the first output signal oscillating at the first phase and the second output signal oscillating at the second phase;
outputting, by a voltage controlled oscillator, the first output signal and the second output signal;
using, by a first multiplexer, the output of the fast phase change detection circuit as a first select signal;
outputting, by the first multiplexer, the first pulse signal or the second pulse signal based on the first select signal, the output of the first multiplexer being used in the feedback loop of the first bandwidth phase lock loop.

8. The apparatus of claim 7, further comprising receiving, by the first multiplexer, the first pulse signal and the second pulse signal.

9. The apparatus of claim 7, further comprising:
outputting, by the first multiplexer, the first pulse signal when the output of the fast phase change detection circuit is the first logic value; and
outputting, by the first multiplexer, the second pulse signal when the output of the fast phase change detection circuit is the second logic value.

10. The method of claim 7, further comprising outputting, by the voltage controller oscillator, the first output signal or the second output signal based on the output of the first multiplexer.

* * * * *